(12) United States Patent
Tsai et al.

(10) Patent No.: US 11,516,926 B2
(45) Date of Patent: Nov. 29, 2022

(54) METHOD FOR MANUFACTURING FLEXIBLE CIRCUIT BOARD

(71) Applicant: InnoLux Corporation, Miao-Li County (TW)

(72) Inventors: Pai-Chi Tsai, Miao-Li County (TW); Wen-Chieh Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 470 days.

(21) Appl. No.: 16/676,893

(22) Filed: Nov. 7, 2019

(65) Prior Publication Data

US 2020/0178402 A1 Jun. 4, 2020

Related U.S. Application Data

(60) Provisional application No. 62/773,217, filed on Nov. 30, 2018.

(30) Foreign Application Priority Data

Aug. 27, 2019 (CN) .......................... 201910795836.8

(51) Int. Cl.
*H05K 3/46* (2006.01)
*H05K 3/04* (2006.01)
*H05K 1/02* (2006.01)

(52) U.S. Cl.
CPC ........... *H05K 3/4691* (2013.01); *H05K 1/028* (2013.01); *H05K 3/04* (2013.01);
(Continued)

(58) Field of Classification Search
CPC ........ H05K 1/028; H05K 3/04; H05K 3/4691; H05K 2201/035; H05K 2201/051; H05K 2201/0909; H05K 2203/0147; H05K 2203/0221; H05K 2203/0228; H05K 2203/0562
See application file for complete search history.

(56) References Cited

U.S. PATENT DOCUMENTS

| 4,980,219 A | * | 12/1990 | Hiraide | ............... H01L 23/4985 |
| | | | | 361/813 |
| 5,148,266 A | * | 9/1992 | Khandros | ............... H01L 25/50 |
| | | | | 257/668 |

(Continued)

FOREIGN PATENT DOCUMENTS

| CN | 102496599 A | 6/2012 |
| EP | 0 692 820 A1 * | 1/1996 |

(Continued)

OTHER PUBLICATIONS

Chinese Office Action dated Nov. 17, 2020, in application No. 201910795836.8.

*Primary Examiner* — Carl J Arbes
(74) *Attorney, Agent, or Firm* — McClure, Qualey & Rodack, LLP

(57) ABSTRACT

A method for manufacturing a flexible circuit board is provided. The method for manufacturing a flexible circuit board includes the following steps: providing a carrier substrate, forming a flexible substrate on the carrier substrate, and forming a plurality of circuit strings on the flexible substrate. A flexible circuit board manufactured by the above method is also provided.

18 Claims, 15 Drawing Sheets

(52) U.S. Cl.
CPC . *H05K 2201/035* (2013.01); *H05K 2201/051* (2013.01); *H05K 2201/0909* (2013.01); *H05K 2203/0147* (2013.01); *H05K 2203/0221* (2013.01); *H05K 2203/0228* (2013.01); *H05K 2203/0562* (2013.01)

(56) References Cited

U.S. PATENT DOCUMENTS

| | | | | |
|---|---|---|---|---|
| 5,614,443 | A * | 3/1997 | Nakashima | H01L 23/5385 257/E21.705 |
| 5,659,952 | A * | 8/1997 | Kovac | H05K 3/4084 257/E21.511 |
| 5,661,086 | A * | 8/1997 | Nakashima | H01L 21/4803 257/E23.068 |
| 5,884,396 | A * | 3/1999 | Lin | H01L 23/3128 438/102 |
| 5,918,746 | A * | 7/1999 | Tokita | H01L 21/568 206/706 |
| 6,049,972 | A * | 4/2000 | Link | H01L 21/67346 29/842 |
| 6,579,748 | B1 * | 6/2003 | Okuno | H01L 23/3178 438/459 |
| 6,687,980 | B1 * | 2/2004 | Link | H01L 21/67333 29/760 |
| 6,914,196 | B2 * | 7/2005 | Cho | H05K 3/0052 174/268 |
| 7,169,643 | B1 * | 1/2007 | Hashimoto | H01L 21/67132 438/114 |
| 7,686,909 | B2 | 3/2010 | Cheng et al. | |
| 8,773,625 | B2 | 7/2014 | Li et al. | |

FOREIGN PATENT DOCUMENTS

| | | | |
|---|---|---|---|
| JP | 2000-188354 A | * | 7/2000 |
| JP | 3610802 B | * | 1/2005 |
| JP | 3695177 B | * | 9/2005 |
| JP | 2014135389 A | * | 7/2014 |
| TW | 200417494 A | | 9/2004 |

* cited by examiner

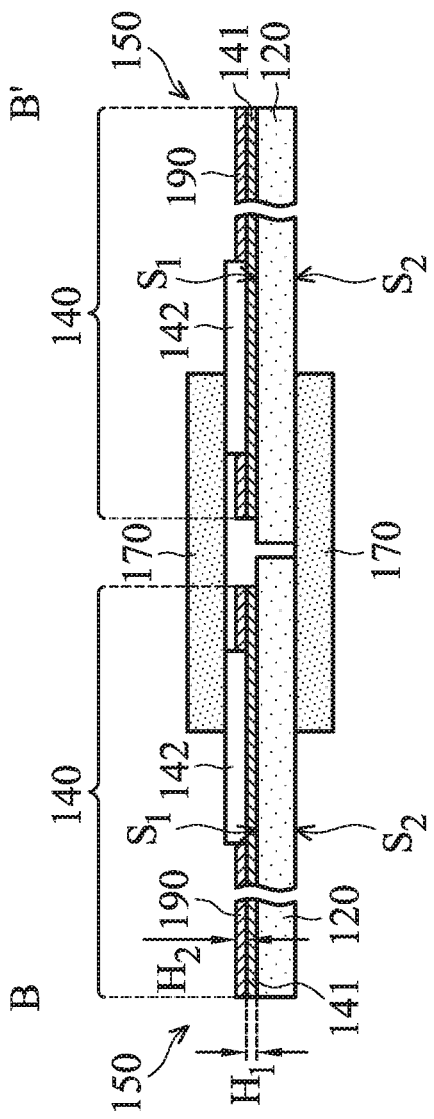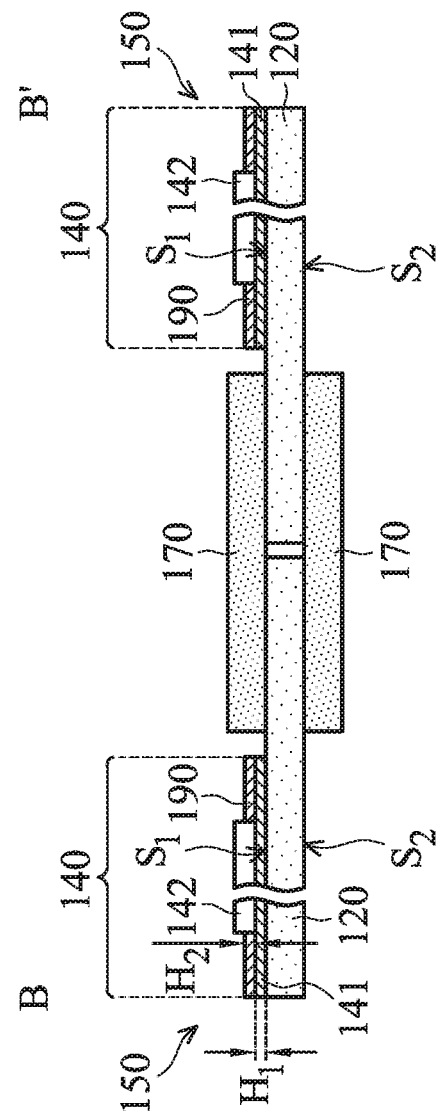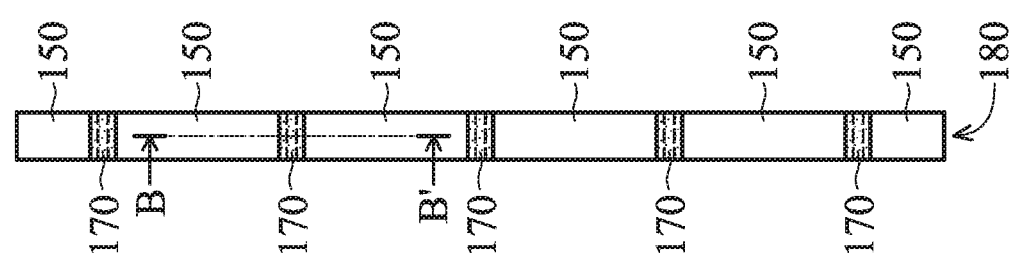
FIG. 6B
FIG. 6C
FIG. 6A

METHOD FOR MANUFACTURING FLEXIBLE CIRCUIT BOARD

CROSS REFERENCE TO RELATED APPLICATIONS

This application claims priority of U.S. Provisional Patent Application No. 62/773,217, filed on Nov. 30, 2018, and Chinese Patent Application 201910795836.8, filed on Aug. 27, 2019, the entirety of which are incorporated by reference herein.

BACKGROUND

Technical Field

The present disclosure relates to a method for manufacturing a flexible circuit board, and in particular it relates to a method for manufacturing a flexible circuit board.

Description of the Related Art

With the development of digital technology, methods for manufacturing flexible circuit boards have been widely used in various aspects of daily life, such as televisions, notebook computers, computers, mobile phones, smart phones and other modern electronic devices.

However, there are still some problems that need be improved in the current method for manufacturing a flexible circuit board. Therefore, there is a need to find a new method for manufacturing a flexible circuit board.

SUMMARY

In accordance with some embodiments of the present disclosure, a method for fabricating a flexible circuit board is provided. The method may include providing a carrier substrate. The method may also include forming a flexible substrate on the carrier substrate. The method may also include forming a plurality of circuit strings on the flexible substrate.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 1A, 2A, 3A, 4A, 5A, 6A and 8A are top-view diagrams of various stages of the method for manufacturing the flexible circuit board in accordance with some embodiments of the present disclosure.

FIGS. 5B and 6B are cross-sectional diagrams corresponding to the line segment B-B' in FIGS. 5A and 6A in accordance with some embodiments of the present disclosure.

FIGS. 5C and 6C are cross-sectional diagrams corresponding to the line segment B-B' in FIGS. 5A and 6A in accordance with some other embodiments of the present disclosure.

DETAILED DESCRIPTION

Figure 1A:
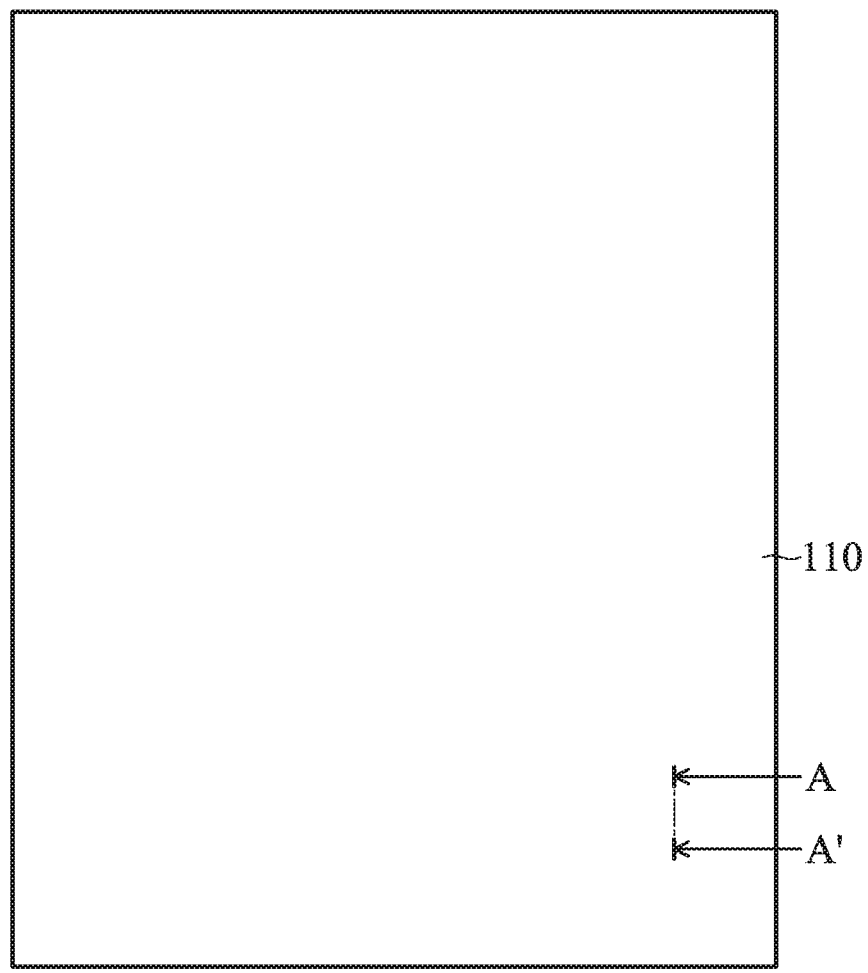

The flexible circuit board of the present disclosure and the method for manufacturing the same are described in detail in the following description. It should be understood that, for purposes of explanation, numerous specific details and embodiments are set forth in the following detailed description in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

The terms "about" and "substantially" typically mean +/−20% of the stated value, or typically mean +/−10% of the stated value, or typically +/−5% of the stated value, or typically +/−3% of the stated value, or typically +/−2% of the stated value, or typically +/−1% of the stated value, or typically +/−0.5% of the stated value. The stated value of the present disclosure is an approximate value. When there is no specific description, the stated value includes the meaning of "about" or "substantially".

It should be understood that, although the terms "first", "second", "third" etc. may be used herein to describe various elements, components, regions, layers and/or portions, these elements, components, regions, layers and/or portions should not be limited by these terms. These terms are only used to distinguish one element, component, region, layer and/or portion from another element, component, region, layer and/or portion. Thus, a first element, component, region, layer and/or portion discussed below could be termed a second element, component, region, layer and/or portion without departing from the teachings of the present disclosure.

Unless defined otherwise, all terms (including technical and scientific terms) used herein have the same meaning as commonly understood by one of ordinary skill in the art to which this disclosure belongs. It should be appreciated that, the term, which is defined in a commonly used dictionary, should be interpreted as having a meaning that conforms to the relative skills of the present disclosure and the background or the context of the present disclosure, and should not be interpreted in an idealized or overly formal manner unless so defined in the embodiments of the present disclosure.

The description of the exemplary embodiments is intended to be read in connection with the accompanying drawings, which are to be considered part of the entire written description. It should be understood that the drawings are not drawn to scale. In addition, structures and devices are shown schematically in order to simplify the drawing. In addition, the structures and devices in the drawings are schematically illustrated in order to clearly illustrate the features of the embodiments of the present disclosure.

In accordance with some embodiments of the present disclosure, relative expressions are used. For example, "lower", "higher", "parallel", "perpendicular", "below", "above", "top" or "bottom" are used to describe the position of one element relative to another and they should be understood as the orientations depicted in the related paragraphs and drawings. The relative terms are used for convenience of description, and do not mean that the described device is to be manufactured or operated in a particular orientation. The terms concerning attachments, coupling and the like, such as "connected" and "interconnected", refer to a relationship wherein the two structures are in direct contact, or are not in direct contact, there being another structure disposed between the two structures, as well as both movable or rigid attachments or relationships, unless expressly described otherwise.

It should be noted that the term "substrate" or "panel" described in the following context may include the elements that have been formed on the substrate and the various film layers overlying the substrate, and any active elements (e.g., transistor elements) may be formed on the substrate if needed. However, the substrate is illustrated herein in the form of a planar substrate in order to simplify the drawing.

Figure 1B:
FIGS. 1B, 2B, 3B, 4B and 8B are cross-sectional diagrams corresponding to the line segment A-A' in FIGS. 1A, 2A, 3A, 4A and 8A in accordance with some embodiments of the present disclosure.

FIGS. 1A, 2A, 3A, 4A, 5A, 6A and 8A are top-view diagrams of a flexible circuit board 10A during various stages of the manufacture in accordance with some embodiments of the present disclosure. Referring to FIG. 1A and FIG. 1B, FIG. 1B is a cross-sectional view along the line segment A-A' in FIG. 1A. First, a carrier substrate 110 may be provided. The carrier substrate 110 may be used to carry a flexible substrate and the components formed thereon. The carrier substrate 110 may be removed in a subsequent process. In some embodiments, the carrier substrate 110 may include a non-flexible substrate. For example, the non-flexible substrate may include, but is not limited to, a glass substrate, a sapphire substrate, another suitable substrate, or a combination thereof.

Figure 2A:
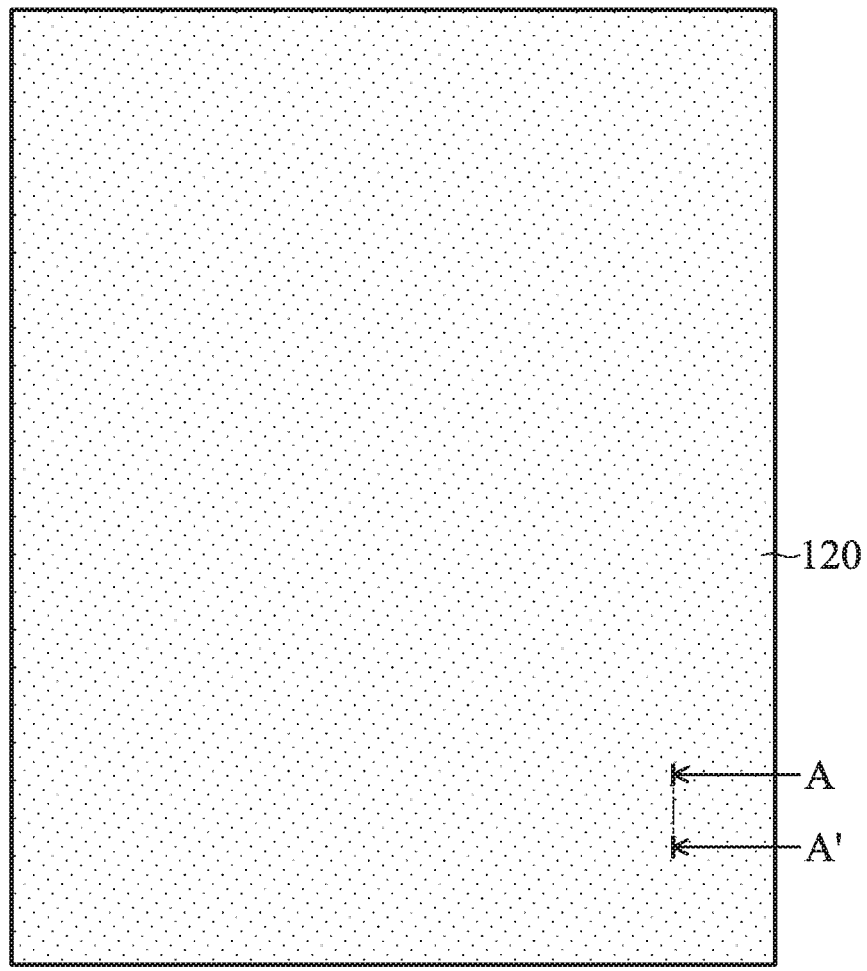
Figure 2B:
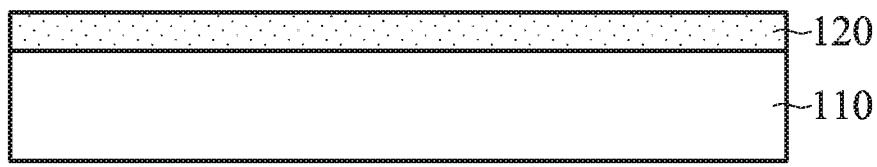

Referring to FIG. 2A and FIG. 2B, FIG. 2B is a cross-sectional view along the line segment A-A' in FIG. 2A. As shown in FIG. 2A and FIG. 2B, after the carrier substrate 110 is formed, a flexible substrate 120 is formed on the carrier substrate 110. In some embodiments, the flexible substrate 120 may include a ceramic substrate, a plastic substrate, another suitable substrate, or a combination thereof. The material of the plastic substrate may include, but is not limited to, polyimine (PI), polyethylene terephthalate (PET), polycarbonate (PC), polyether oxime (PES), polybutylene terephthalate (PBT), polynaphthalene ethylene glycolate (PEN) or polyarylate (PAR), another suitable material, or a combination thereof.

Figure 3A:
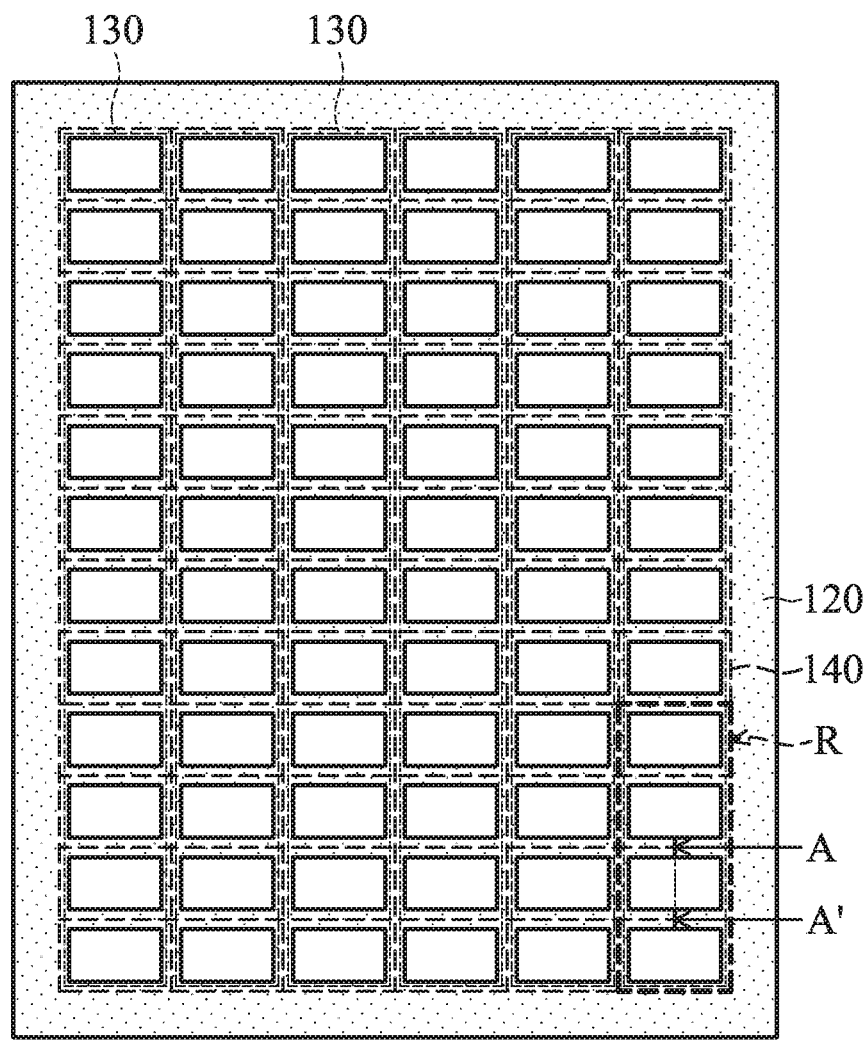
Figure 3B:
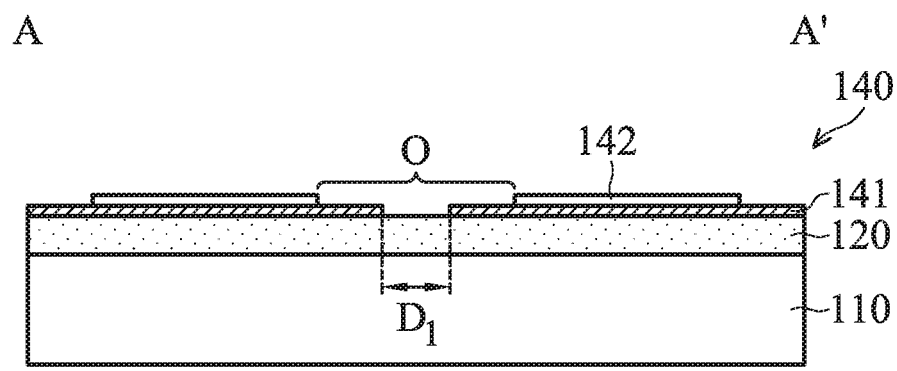

Referring to FIG. 3A and FIG. 3B, FIG. 3B is a cross-sectional view along the line segment A-A' in FIG. 3A. As shown in FIG. 3A and FIG. 3B, after the flexible substrate 120 is formed, a plurality of circuit strings 130 are formed on the flexible substrate 120. The circuit string 130 may include a plurality of circuit areas 140. In some embodiments, the extending direction of the circuit string 130 may be the same as the arrangement direction of the circuit areas 140, but it is not limited thereto. Furthermore, the two adjacent circuit areas 140 may be electrically insulated from each other.

As shown in FIG. 3B, the circuit area 140 may include a first metal layer 141 and a solder resist layer 142. The first metal layer 141 may be formed on the flexible substrate 120. The material of the first metal layer 141 may include metals. For example, the metals may include, but is not limited to, molybdenum (Mo), titanium (Ti), copper (Cu), aluminum (Al), silver (Ag), tungsten (W), gold (Au), chromium (Cr). nickel (Ni), platinum (Pt), iridium (Ir), rhodium (Rh), indium (In), bismuth (Bi), another suitable material, alloys thereof, or a combination thereof.

The first metal layer 141 may be formed by a physical vapor deposition process, a chemical vapor deposition process, an atomic layer deposition process, a chemical plating process, or a combination thereof, but it is not limited thereto. In addition, the first metal layer 141 may be patterned by using a lithography process and an etching process. The lithography process may include photoresist coating (e.g., spin coating), soft baking, mask aligning, exposure, post-exposure baking, developing the photoresist, rinsing, drying (e.g., hard baking), another suitable process, or a combination thereof, but it is not limited thereto. In addition, the lithography process may be performed or replaced by another suitable method, such as maskless lithography, electron-beam writing, or ion-beam writing, but it is not limited thereto. The etching process may include, but is not limited to, a dry etching process, a wet etching process, or another suitable etching process. As shown in FIG. 3B, the patterned first metal layer 141 may have a gap $D_1$. The gap $D_1$ may be a gap of the patterned first metal layer 141 in the direction that is perpendicular to the normal direction of the flexible substrate 120 in any cross section of a partial region. In some embodiments, the distance of the gap $D_1$ may be in a range from 0.3 mm to 8 mm (0.3 mm≤gap $D_1$≤8 mm), but it is not limited thereto. When the gap $D_1$ is within the range described above, it is more suitable for the wafer to be formed on the first metal layer 141.

The solder resist layer 142 may be formed on the first metal layer 141, and the solder resist layer 142 may have an opening O to expose a portion of the first metal layer 141. The portion of the first metal layer 141 that is not covered by the solder resist layer 142 may be used as the space for electrical connection with the wafer that is subsequently formed. In some embodiments, the solder resist layer 142 may include an insulating material. For example, the insulating material may include, but is not limited to, a solder mask, an epoxy resin, an inorganic material (e.g., silicon oxide, silicon nitride, silicon oxynitride, metal oxide, or a combination thereof), an organic polymer material (e.g., polyimide resin, benzocyclobutene, parylene, naphthalene polymer, fluorocarbon, or acrylate), another suitable insulating material, or a combination thereof.

Figure 3C:
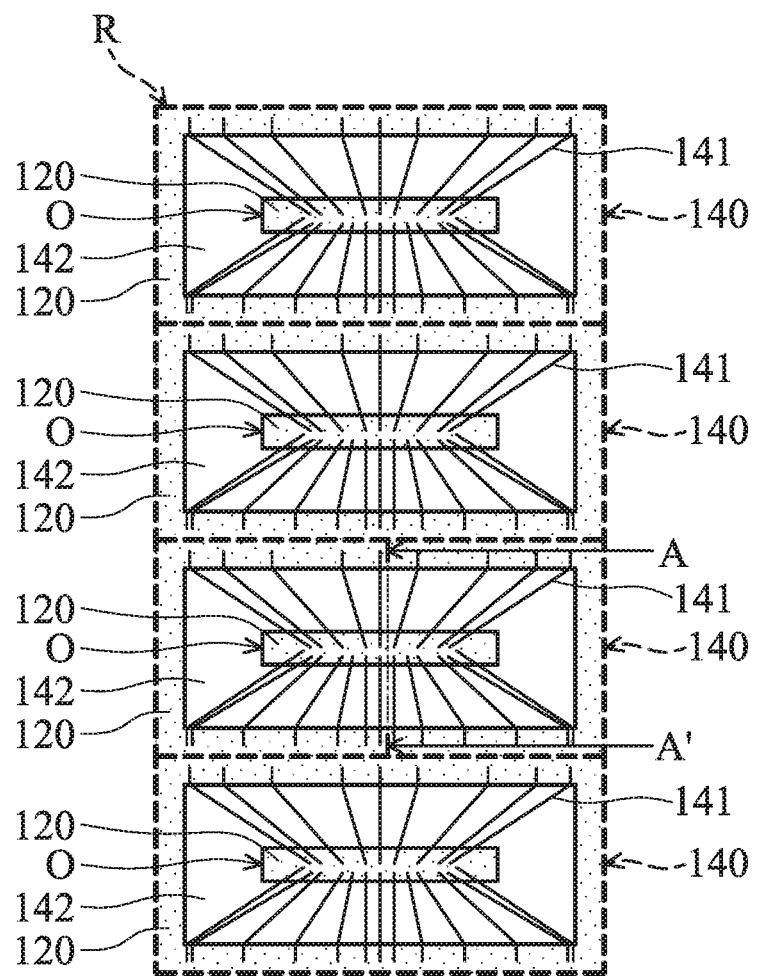
FIGS. 3C and 4C are partially enlarged diagrams of the structures illustrated in FIGS. 3A and 4A.

Referring to FIG. 3C, FIG. 3C is a partially enlarged diagram of the region R in FIG. 3A. It should be noted that in order to clearly depict the layout of the flexible substrate 120, the first metal layer 141 and the solder resist layer 142, the portions of the first metal layer 141 that are covered by the solder resist layer 142 are still illustrated with solid lines. As shown in FIG. 3C, the circuit areas 140 may respectively include the first metal layer 141 and the solder resist layer 142, and the solder resist layer 142 may have an opening O. The first metal layer 141 may be partially covered by the solder resist layer 142, but it is not limited thereto. In some embodiments, the opening O of the solder resist layer 142 may expose a portion of the flexible substrate 120. In some embodiments, the opening O of the solder resist layer 142 may expose a portion of the flexible substrate 120 and a portion of the first metal layer 141. In some embodiments, a portion of the flexible substrate 120 may be exposed between the solder resist layers 142 in adjacent circuit areas 140. In some embodiments, a portion of the flexible substrate 120 and a portion of the first metal layer 141 may be exposed between the solder resist layers 142 in adjacent circuit areas 140.

Figure 4A:
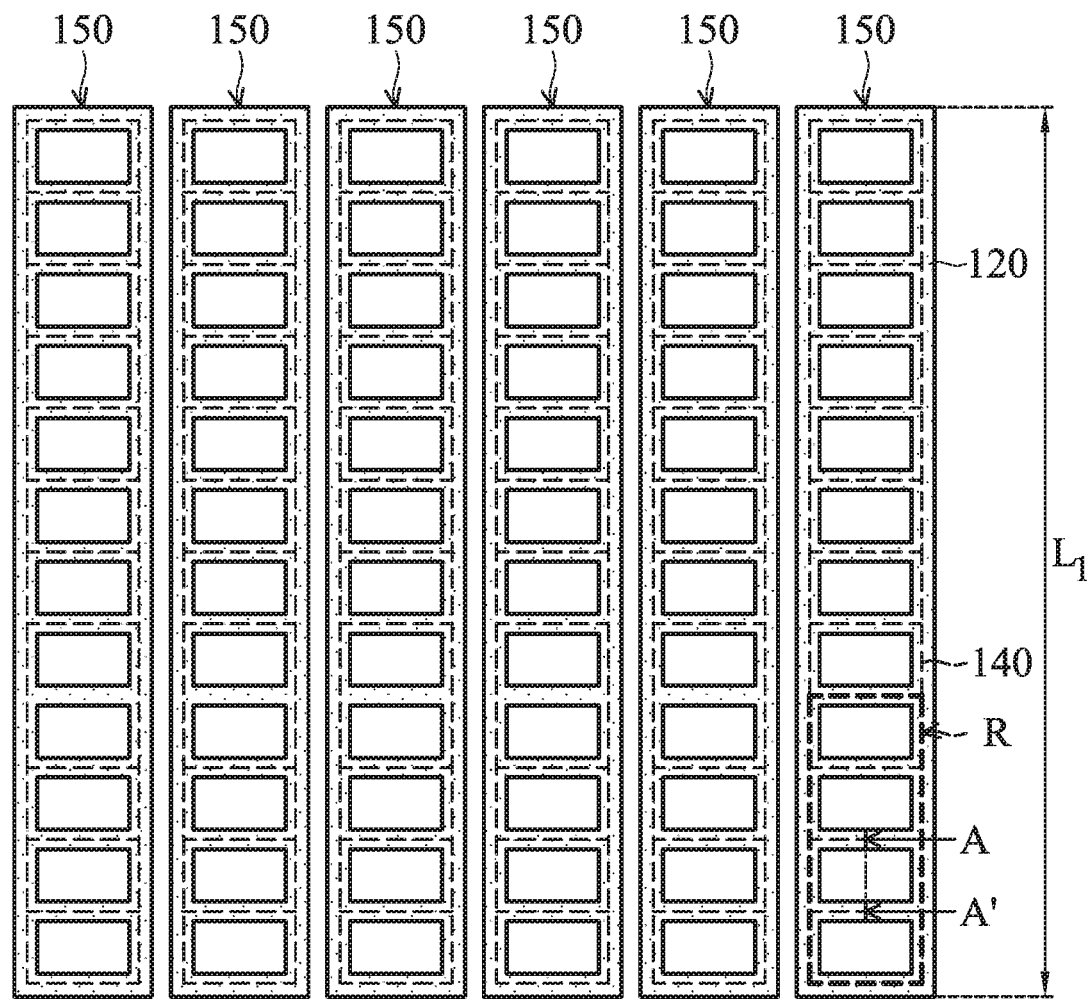
Figure 4B:
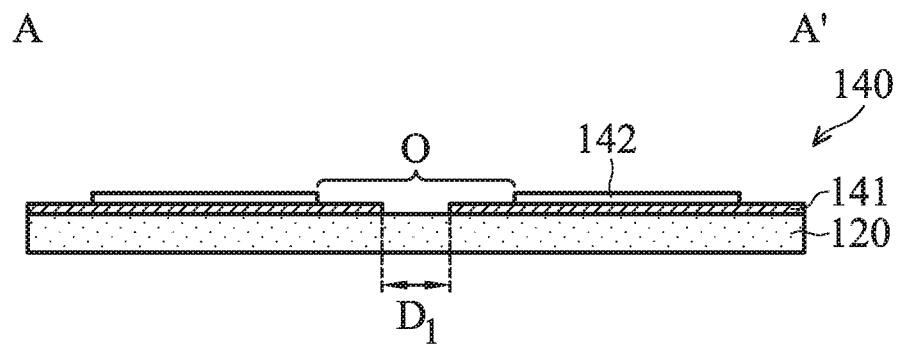
Figure 4C:
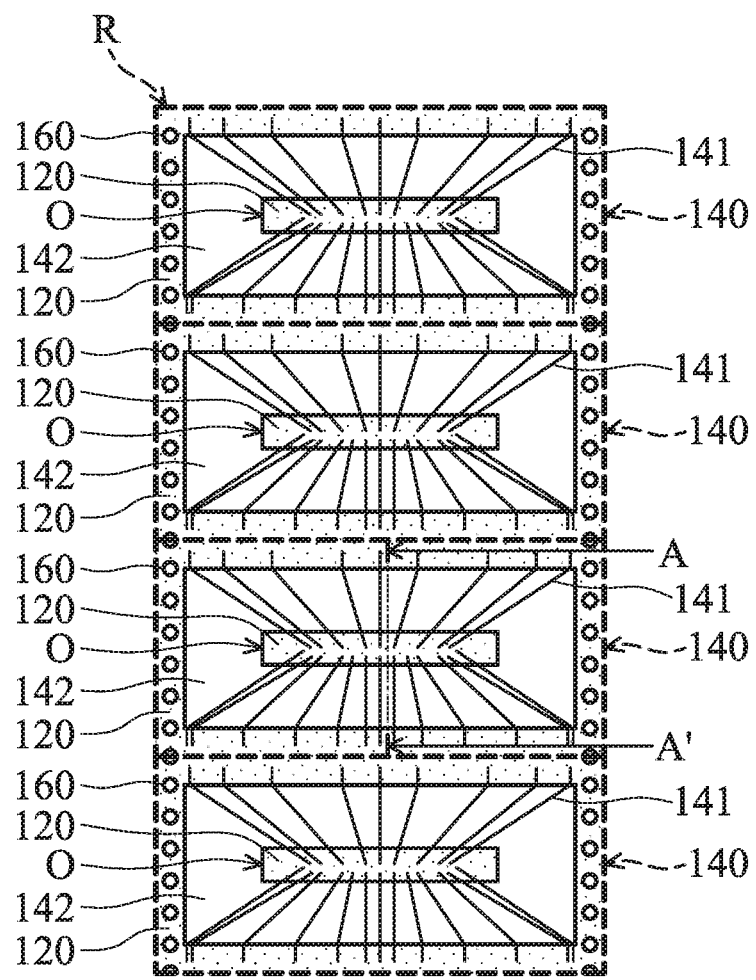

Referring to FIGS. 4A-4C, FIG. 4B is a cross-sectional view along the line segment A-A' in FIG. 4A, and FIG. 4C is a partially enlarged diagram of the region R in FIG.4A. In some embodiments, after the circuit strings 130 (not illustrated) are formed on the flexible substrate 120, a cutting process, and the steps of removing the carrier substrate 110 and forming perforations 160 may be performed. In some embodiments, the order of the cutting process, the removal of the carrier substrate 110, and the formation of the perforations 160 may be interchanged, or may be inserted or replaced with other steps according to need, but it is not limited thereto. For example, the carrier substrate 110 may be removed first, and then the cutting process may be performed to form a plurality of circuit tapes 150, and then the perforations 160 may be formed; or the carrier substrate 110 may be removed first, then the perforations 160 may be formed, and then the cutting process may be performed to form a plurality of circuit tapes 150, but the present disclosure is not limited thereto.

As shown in FIG. 4A, the cutting process may be performed on the flexible substrate 120 to form a plurality of separated circuit tapes 150. The cutting process may include, but is not limited to, a laser cutting process, a mechanical sawing process, a blade sawing process, another suitable process, or a combination thereof.

In some embodiments, the circuit tape 150 may include the flexible substrate 120 and several circuit areas 140. In some embodiments, the circuit tape 150 may have a length $L_1$, and the length $L_1$ may be in a range from 300 mm to 5000 mm (300 mm≤the length $L_1$≤5000 mm). In some embodiments, the length $L_1$ may be in a range from 350 mm to 950 mm (350 mm≤the length $L_1$≤950 mm), but it is not limited thereto. In some embodiments, the circuit tapes 150 may respectively include 3 to 350 circuit areas 140 (3≤the number of circuit areas 140≤350). In some embodiments, the circuit tapes 150 may respectively include 3 to 65 circuit areas 140 (3≤the number of circuit areas 140≤65). When the number of circuit areas 140 is within one of the above ranges, the requirements of the current product specifications are more likely to be met.

As shown in FIG. 4B, the carrier substrate 110 may be removed from the flexible substrate 120. In some embodiments, the carrier substrate 110 may be removed prior to the cutting of the flexible substrate 120, but it is not limited thereto.

As shown in FIG. 4A and FIG. 4C, several perforations 160 may be formed on both sides of the circuit tape 150. The perforations 160 may be arranged along the direction of the length $L_1$ of the circuit tape 150 and may penetrate through the flexible substrate 120, but they are not limited thereto. In the subsequent step of winding the circuit chain, the perforations 160 may have the function of aligning or fixing to facilitate transport or winding. As shown in FIG. 4C, the perforations 160 and the first metal layer 141 may not overlap in a top-view perspective, or the perforations 160 and the solder resist layer 142 may not overlap in a top-view perspective.

Figure 5B:
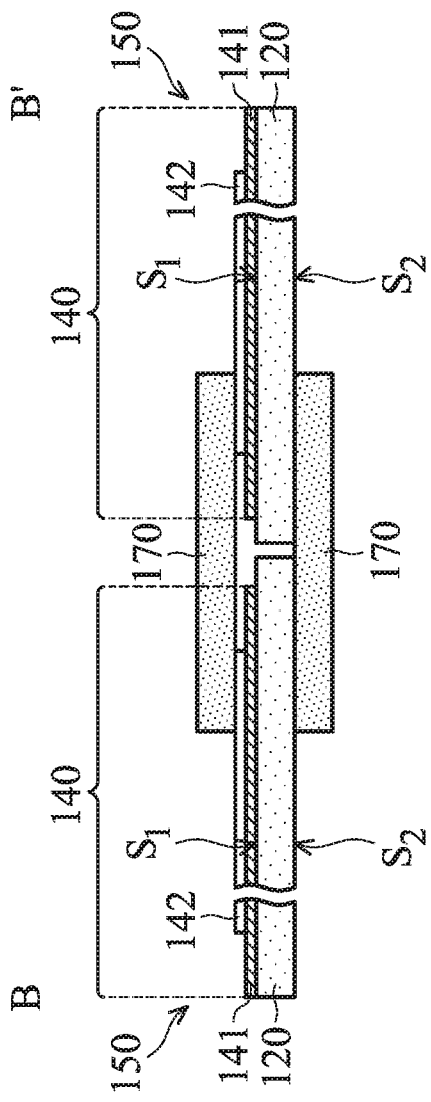
Figure 5C:
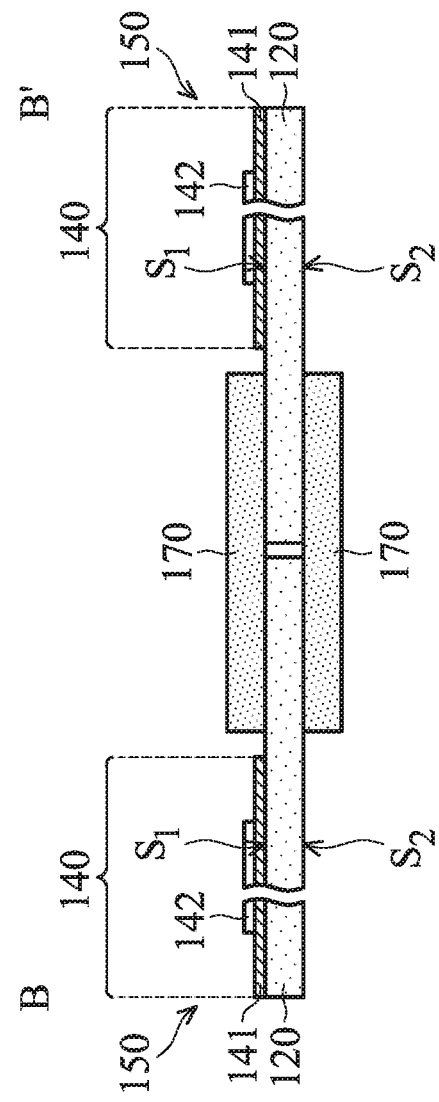
Figure 5A:
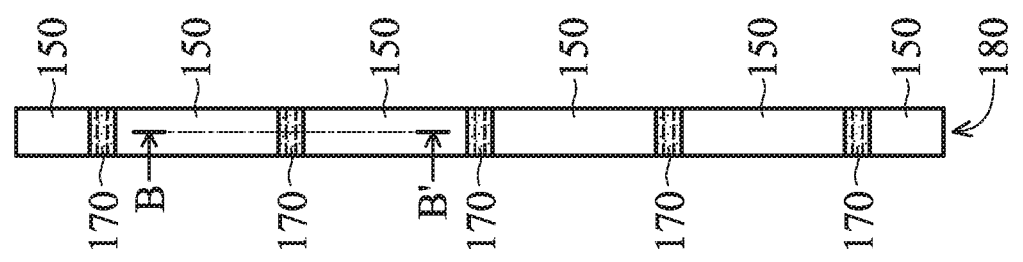

Referring to FIG. 5A and FIG. 5B, FIG. 5B is a cross-sectional view along the line segment B-B' in FIG. 5A. In some embodiments, after several circuit tapes 150 are formed, portions of several circuit tapes 150 are connected to form a circuit chain 180. It should be noted that in order to clearly express the relationship between the circuit tapes 150, connection structures 170 and the circuit chain 180, some of the components on the circuit tapes 150 are omitted.

In some embodiments, the two circuit tapes 150 may be connected by the connection structure 170. As shown in FIG. 5B, the connection structure 170 may be formed on a surface $S_1$ and a surface $S_2$ of the flexible substrate 120 to connect the two circuit tapes 150. In some embodiments, the connection structure 170 may extend from the solder resist layer 142 of one of the circuit tapes 150 to the solder resist layer 142 of the other circuit tape 150. In some embodiments, the connection structure 170 may be formed on the surface $S_2$ of the flexible substrate 120. In some embodiments, a portion of the connection structure 170 may be formed within the circuit area 140 and a portion of the connection structure 170 may be formed outside of the circuit area 140 (or between the circuit areas 140). For example, the connection structure 170 formed on the surface $S_1$ of the flexible substrate 120 may extend from the solder resist layer 142 within the circuit area 140 of one of the circuit tapes 150 to the solder resist layer 142 within the circuit area 140 of the other circuit tape 150, but it is not limited thereto. The connection structure 170 formed on the surface $S_2$ of the flexible substrate 120 may extend from the circuit area 140 of one of the circuit tapes 150 to the circuit area 140 of the other circuit tape 150, but it is not limited thereto. In some other embodiments (not illustrated), the connection structure 170 formed on the surface $S_2$ of the flexible substrate 120 may be formed outside the circuit area 140, so the area of the connection structure 170 formed on the surface $S_1$ may be greater than the area of the connection structure 170 formed on the surface $S_2$, or the width of the connection structure 170 formed on the surface $S_1$ may be greater than the width of the connection structure 170 formed on the surface $S_2$, but it is not limited thereto.

In some embodiments, the connection structure 170 may be formed on portions of the circuit areas 140 on the circuit tape 150 as shown in FIG. 5A. That is, the connection structure 170 may not be formed on other portions of the circuit area 140 on the circuit tape 150. In this case, the structure of the circuit area 140 in which the connection structure 170 is not formed may maintain the structure as shown in FIG. 4B.

Referring to FIG. 5C, in some embodiments, the connection structure 170 may be directly connected to the surface $S_1$ of the flexible substrate 120 and the two circuit tapes 150 may be joined via the surface $S_1$ that connects the flexible substrates 120. In some embodiments, the connection structure 170 may be directly connected to the surface $S_2$ of the flexible substrate 120 and the two circuit tapes 150 may be joined via the surface $S_2$ that connects the flexible substrates 120. In this embodiment, the connection structure 170 on the surface $S_1$ and the surface $S_2$ of the flexible substrate 120 may be formed outside the circuit area 140 (or between the circuit areas 140), but it is not limited thereto.

In some embodiments, one circuit chain 180 may include 40 to 260 circuit tapes 150 (40≤number of the circuit tapes 150≤260). When the number of circuit tapes 150 is within the above range, the circuit chain 180 having a suitable length may be obtained.

Referring to FIG. 6A and FIG. 6B, FIG. 6B is a cross-sectional view along the line segment B-B' in FIG. 6A. In some embodiments, after the circuit chain 180 is formed, a second metal layer 190 may be formed on the first metal layer 141. In some embodiments, the second metal layer 190 may be formed by a physical vapor deposition process, a chemical vapor deposition process, an atomic layer deposition process, or a chemical plating process, but it is not limited thereto. As shown in FIG. 6B, taking the chemical plating process as an example, the second metal layer 190 may be formed above the first metal layer 141, and the second metal layer 190 may be not formed above the solder resist layer 142. The second metal layer 190 may be disposed to be electrically connected to another electronic component (not illustrated). The material of the second metal layer 190 may include, but is not limited to, molybdenum (Mo), titanium (Ti), copper (Cu), aluminum (Al), silver (Ag), tungsten (W), gold (Au), chromium (Cr), nickel (Ni), platinum (Pt), iridium (Ir), rhodium (Rh), indium (In), bismuth (Bi), another suitable material, alloys thereof, or a combination thereof. In some embodiments, the material of the second metal layer 190 may be the same as the first metal layer 141. In some embodiments, the material of the second metal layer 190 may be different from the first metal layer 141.

In some embodiments, the first metal layer 141 may have a thickness $H_1$ and the second metal layer 190 may have a thickness $H_2$. In some embodiments, the thickness $H_1$ may be the maximum thickness of the first metal layer 141 in the normal direction of the flexible substrate 120, and the thickness $H_2$ may be the maximum thickness of the second metal layer 190 in the normal direction of the flexible substrate 120. In some embodiments, the thickness $H_1$ may be in a range from 0.15 μm to 3 μm (0.15 μm≤the thickness $H_1$≤3 μm). In some embodiments, the thickness $H_2$ may be in a range from 0.3 μm to 15 μm (0.3 μm≤the thickness $H_2$≤15 μm).

Referring to FIG. 6C, when the connection structure 170 directly contacts the surface $S_1$ and the surface $S_2$ of the flexible substrate 120, the connection structure 170 does not cover the first metal layer 141 and the second metal layer 190. In other words, the connection structure 170 does not overlap with the first metal layer 141 in the normal direction of the flexible substrate 120, and the connection structure 170 does not overlap with the second metal layer 190 in the normal direction of the flexible substrate 120.

When the second metal layer 190 is formed, the thickness of the wires that are in contact with other electronic components may be increased, and may reduce the contact resistance between the wafer and the wires when the wafer is subsequently bonded. Therefore, the yield of the product may be improved, or the reliability of the product may be increased.

Figure 7B:
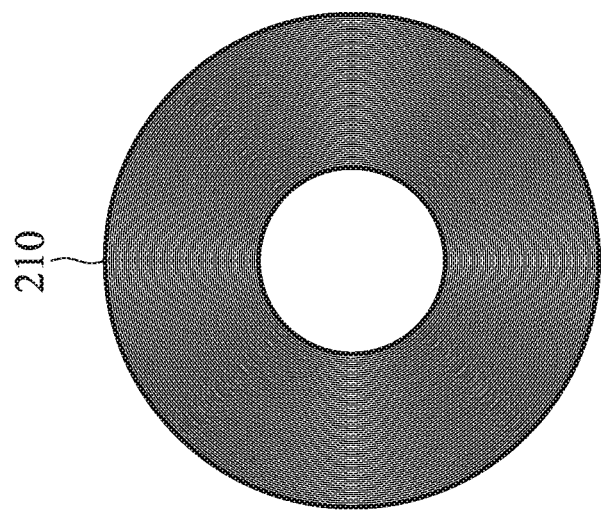
FIGS. 7A and 7B are diagrams showing the winding of circuit chains in accordance with some other embodiments of the present disclosure.
Figure 7A:
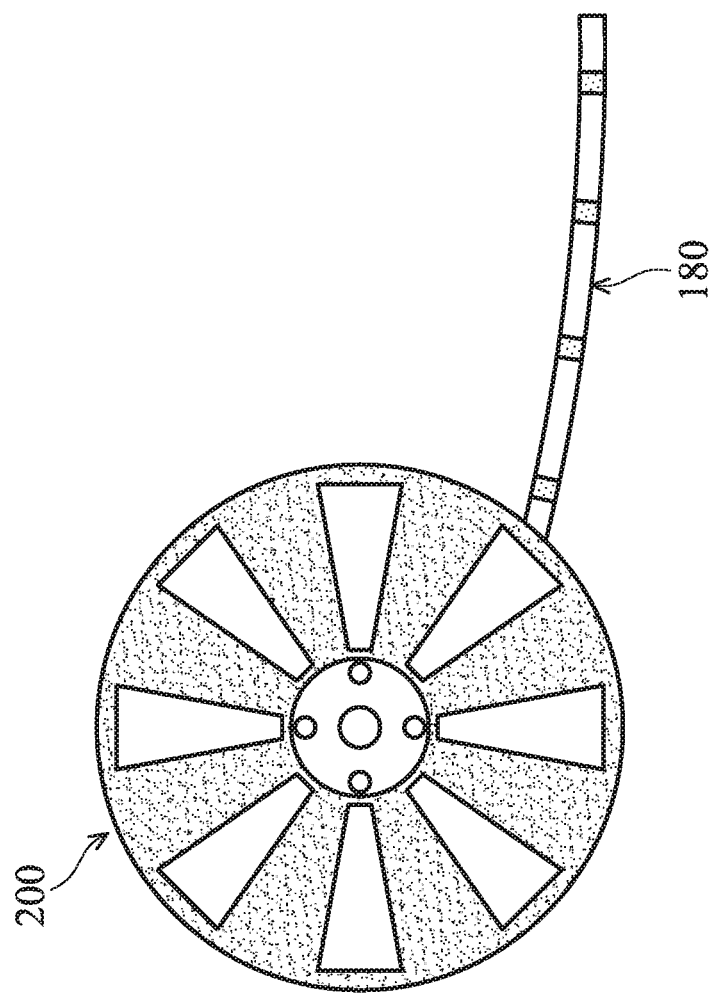

Referring to FIG. 7A and FIG. 7B, in accordance with some embodiments, the circuit chain 180 may be wound by a winder 200 to form a circuit coil 210 as shown in FIG. 7B. In some embodiments, the circuit coil 210 may be formed prior to the second metal layer 190 is formed. In some embodiments, a plurality of wafers 220 may be combined on the circuit chain 180. Specifically, the wafer 220 may be disposed within at least one opening O of the solder resist layer 142 of the circuit chain 180, but it is not limited thereto.

Figure 8A:
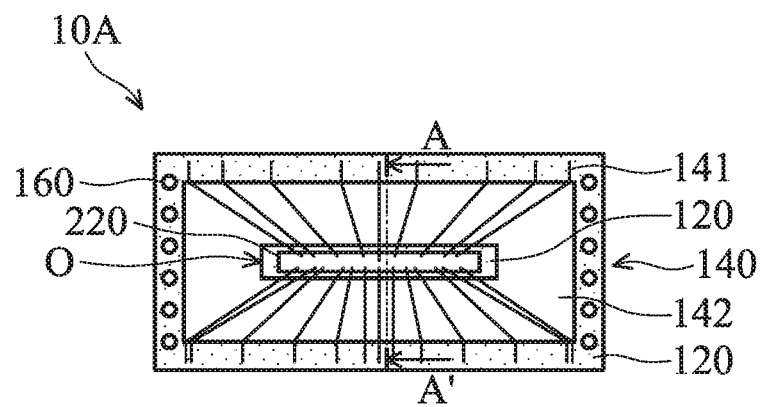
Figure 8B:
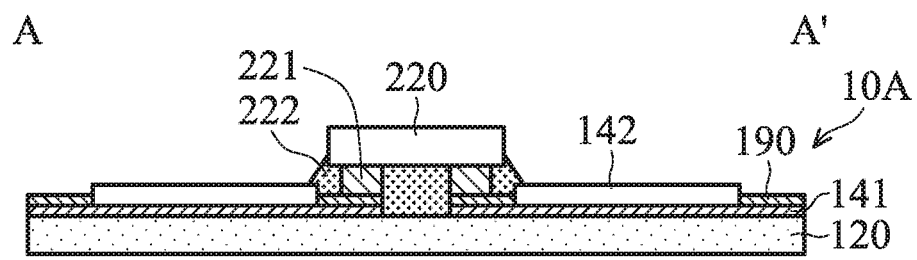

Referring to FIG. 8A and FIG. 8B, the cutting process may be performed on the circuit coil 210. Specifically, the circuit coil 210 may be placed in a cutting machine, and the cutting process may be performed on the circuit areas 140 that are to be used to cut them into several separated the circuit areas 140 and to form the flexible circuit board 10A. FIG. 8B is a cross-sectional view taken along the line segment A-A' in FIG. 8A. As shown in FIG. 8B, the wafer 220 may be electrically connected to the first metal layer 141 by a conductive pad 221, and a molding material 222 may cover the conductive pad 221 and a portion of the solder resist layer 142.

In some embodiments, the wafer 220 may include a plurality of active components and/or passive components. The active device may include, but is not limited to, thin film transistors (TFTs), P-channel field-effect transistors (PFETs), N-channel field effect transistors (NFETs), metal-oxide-semiconductor field-effect transistors (MOSFETs), complementary metal-oxide-semiconductor (CMOS) transistors, bipolar transistors, high-voltage transistors, high-frequency transistors, other suitable components, or a combination thereof. The passive component may include, but is not limited to, an inductor, a capacitor, a resistor, another suitable component, or a combination thereof.

The conductive pad 221 may include a metal material. The material of the conductive pad 221 may be the same as or similar to that of the second metal layer 190, and therefore will not be repeated herein. The molding material 222 may include, but is not limited to, an epoxy, another suitable material, or a combination thereof. The molding material 222 may be formed on the flexible substrate 120 and the first metal layer 141 by molding, lamination, or another suitable method, but it is not limited thereto.

Figure 9:
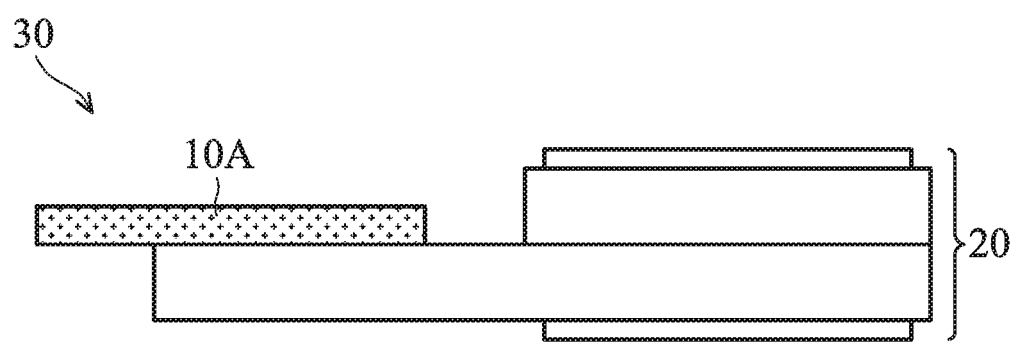
FIG. 9 is a cross-sectional diagram of the electronic device in accordance with some embodiments of the present disclosure.

Referring to FIG. 9, FIG. 9 is a cross-sectional view of an electronic device 30 in accordance with some embodiments of the present disclosure. In some embodiments, the flexible circuit board 10A may be disposed on a display panel 20 to form the electronic device 30. The display panel 20 may include, but is not limited to, a plurality of thin film transistors (not illustrated), such as switching transistors, driving transistors, reset transistors, or another thin film transistor. The display panel 20 may also include a display medium (not illustrated)) such as an inorganic light-emitting diode, an organic light-emitting diode, a liquid-crystal layer, a quantum dot, fluorescence, phosphorescence, another suitable display medium, or a combination thereof, but it is not limited thereto.

In some embodiments, the inorganic light-emitting diode may include, for example, a micro light-emitting diode (micro LED or mini LED) or a quantum dot light-emitting diode (QLED or QDLED), but it is not limited thereto. The inorganic light-emitting diode may include a light-emitting layer, and the light-emitting layer may include, but is not limited to, a homojunction, a heterojunction, a single-quantum well (SQW), a multiple quantum well (multiple-quantum well, MQW), or another similar structure, or a combination thereof. In some embodiments, the light-emitting layer may include, for example, undoped n-type $In_xGa_{(1-x)}N$, $Al_xIn_yGa_{(1-x-y)}N$, or another commonly used material, but it is not limited thereto. In addition, the light-emitting layer may be a multiple quantum well structure including multiple well layers (e.g., InGaN) and barrier layers (e.g., GaN), but it is not limited thereto.

In some embodiments, the organic light-emitting diode may include at least one of an emission layer (EML), a hole injection layer (HIL), a hole transport layer (HTL), an electron injection layer (EIL) and an electron transport layer (ETL), but it is not limited thereto.

In some embodiments, the material of the liquid-crystal layer may include, but is not limited to, nematic liquid crystal, smectic liquid crystal, cholesteric liquid crystal, blue phase liquid crystal, another suitable liquid-crystal material, or a combination thereof.

Figure 10A:
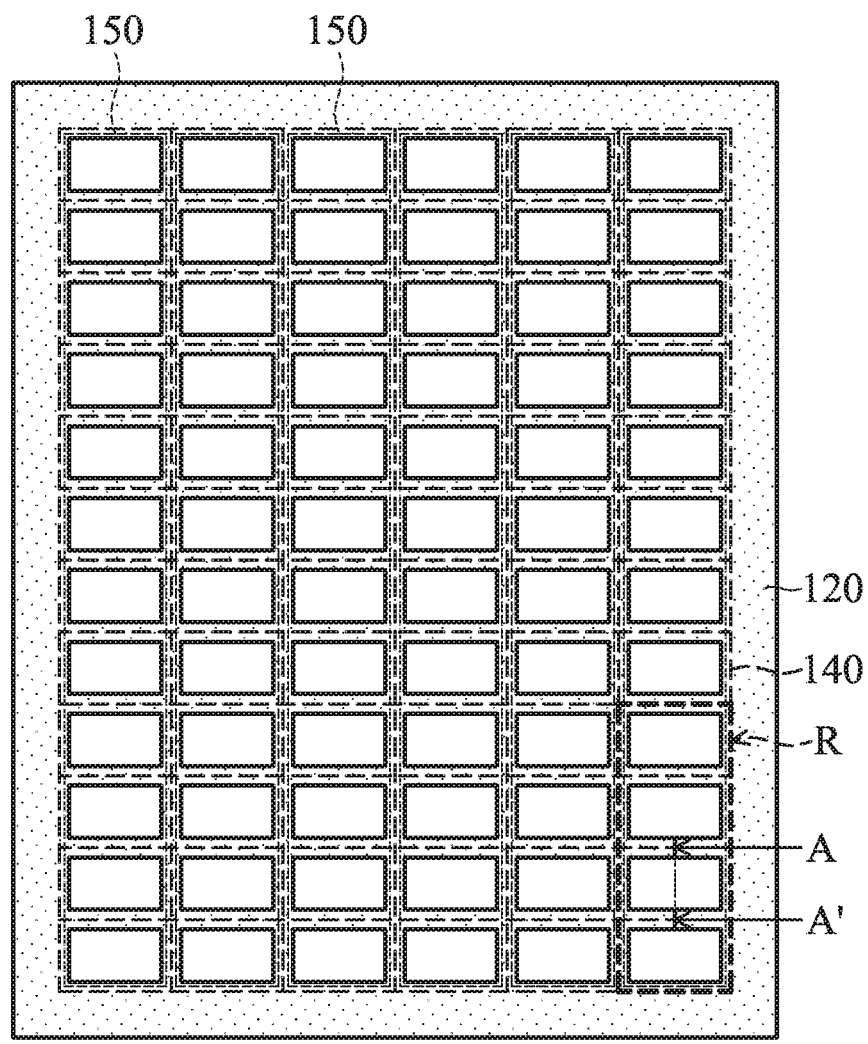
FIGS. 10A, 11A and 12A are top-view diagrams of various stages of the method for manufacturing the flexible circuit board in accordance with some other embodiments of the present disclosure.
Figure 10B:
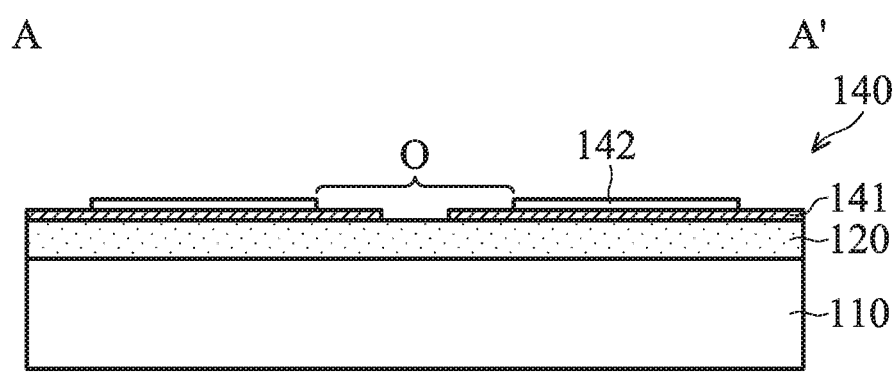
FIGS. 10B, 11B and 12B are cross-sectional diagrams corresponding to the line segment A-A' in FIGS. 10A, 11A and 12A in accordance with some embodiments of the present disclosure.

Refer to FIGS. 10A-12A and FIGS. 10B-12B, which illustrate top-view diagrams of a flexible circuit board 10B during various stages of the manufacture in accordance with some other embodiments of the present disclosure. The elements and manufacturing methods of the structures shown in FIG. 10A and FIG. 10B are the same as or similar to the elements and manufacturing methods shown in FIGS. 1A-4A and FIGS. 1B-4B as described above, and thus will not be repeated herein. As shown in FIG. 10A and FIG. 10B, the cutting process may be performed on the flexible substrate 120 to form several circuit tapes 150. The circuit tapes 150 respectively include several circuit areas 140, and the circuit areas 140 include the patterned first metal layer 141 and solder resist layer 142. In some embodiments, the circuit areas 140 shown in FIGS. 10A-12A and FIGS. 10B-12B may include the patterned first metal layer 141 and second metal layer 190, and the elements and the method of manufacturing the same are the same or similar to that of FIGS. 6A-6C, and thus will not be repeated herein. The following description is made with the metal layer 141, but it is not limited thereto.

Figure 11A:
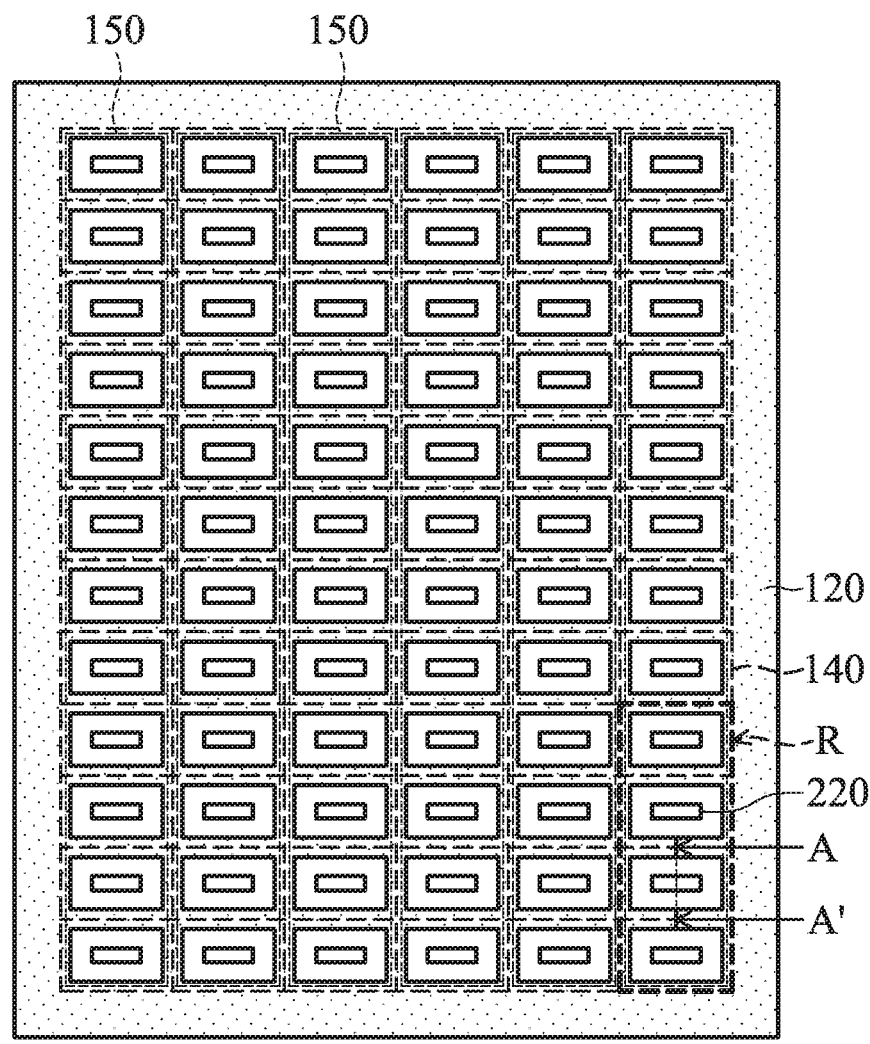
Figure 11B:
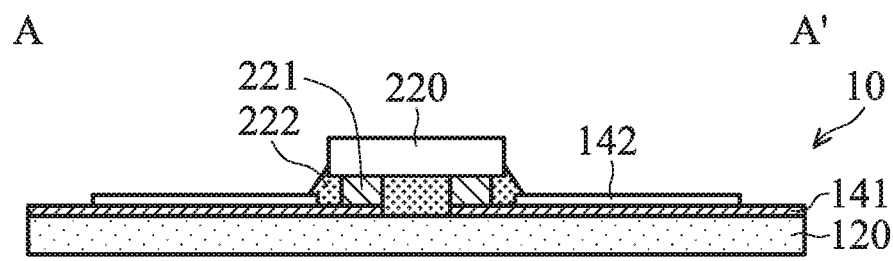
Figure 12A:
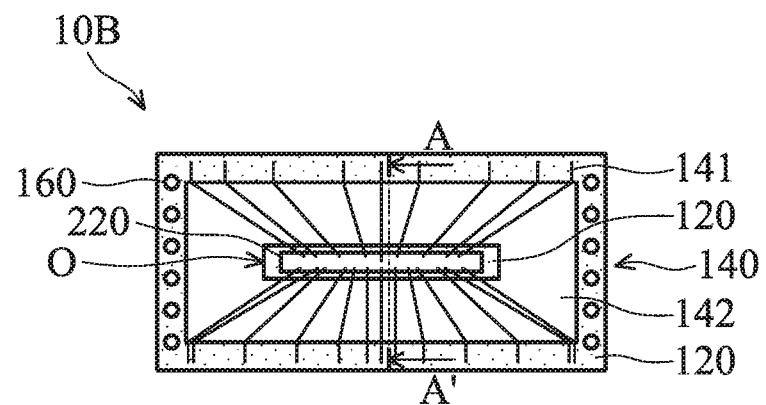
Figure 12B:
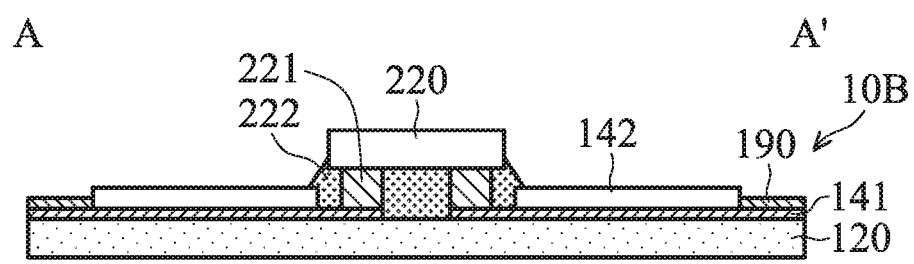

Referring to FIG. 11A and FIG. 11B, in accordance with some embodiments, the wafer 220 may be connected to first metal layer 141 after the circuit tapes 150 are formed and prior to the bonding of portions of the circuit tapes 150. Thereafter, the processes that are the same as or similar to that of FIGS. 4A-7B may be performed to form the circuit coil 210. Next, the cutting process may be performed on the circuit coil 210 to form the flexible circuit board 10B as shown in FIG. 12A and FIG. 12B. In some embodiments, the wafer 220 may be connected to the first metal layer 141 after the circuit strings 130 are formed and prior to the circuit tapes 150 are formed, but they are not limited thereto. In addition, as described above, in some embodiments, the circuit area 140 may include the patterned second metal layer 190, as shown in the flexible circuit board 10B of FIG. 12B.

Figure 13A:
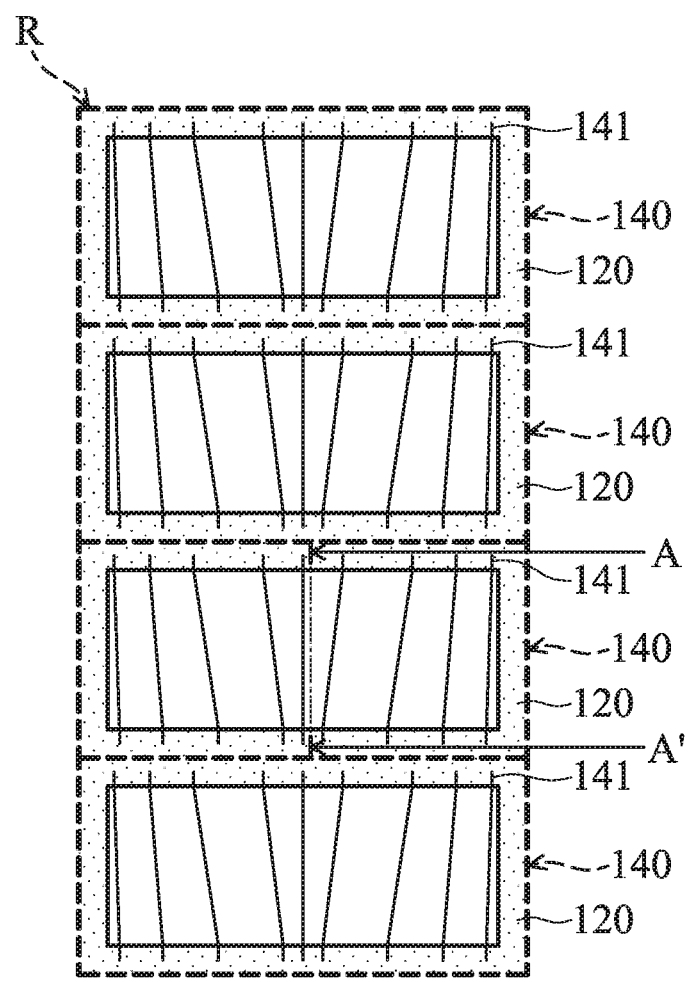
FIGS. 13A and 14 are top-view diagrams of various stages of the method for manufacturing the flexible circuit board in accordance with some other embodiments of the present disclosure.
Figure 13B:
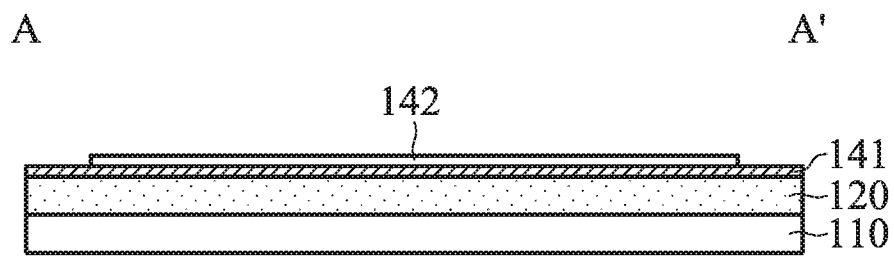
FIG. 13B is cross-sectional diagrams corresponding to the line segment A-A' in FIG. 13A in accordance with some embodiments of the present disclosure.
Figure 14:
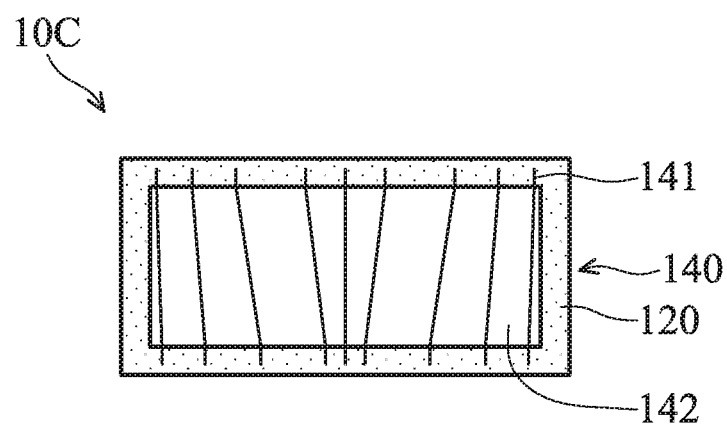

Refer to FIG. 13A and FIG. 13B, which illustrate a top-view diagram and a cross-sectional diagram of a flexible circuit board 10C during the stage of manufacture in accordance with some other embodiments of the present disclosure. The elements and manufacturing methods of the structures shown in FIG. 13A and FIG. 13B are the same as or similar to the elements and manufacturing methods shown in FIGS. 1A-2A and FIGS. 1B-2B as described above, and thus will not be repeated herein. In some embodiments, as shown in FIG. 13A and FIG. 13B, the opening O may be not formed when the circuit area 140 is formed. Thereafter, the processes that are the same as or similar to that of FIGS. 4A-7B may be performed to form the circuit coil 210. Next, the cutting process may be performed on the circuit coil 210 to form several flexible circuit boards 10C as shown in FIG. 14. In this embodiment, the wafer 220 may be not formed on the first metal layer 141.

In some embodiments, the flexible circuit board 10B and the flexible circuit board 10C may also be disposed on the display panel 20 to form the electronic device 30. In some embodiments, the electronic device may include, for example, a display device, a lighting device, a sensing device, an antenna device, a tiled device, another suitable device, or a combination thereof, but the present disclosure is not limited thereto.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments.

What is claimed is:

1. A method for manufacturing a flexible circuit board, comprising:
   providing a carrier substrate;
   forming a flexible substrate on the carrier substrate;
   forming a plurality of circuit strings on the flexible substrate;
   cutting the flexible substrate to form a plurality of circuit tapes; and
   connecting at least a portion of the plurality of circuit tapes to form a circuit chain after cutting the flexible substrate.

2. The method of claim 1, further comprising:
   removing the carrier substrate prior to cutting the flexible substrate.

3. The method of claim 1, wherein at least one of the plurality of circuit tapes comprises between 3 and 350 regions where a circuit is disposed.

4. The method of claim 1, wherein at least one of the plurality of circuit tapes has a length and the length is in a range from 300 mm to 5000 mm.

5. The method of claim 1, wherein the at least a portion of the plurality of circuit tapes are connected by at least one connection structure.

6. The method of claim 1, further comprising:
   winding the circuit chain to form a circuit coil.

7. The method of claim 6, further comprising:
   cutting the circuit coil.

8. The method of claim 6, further comprising:
   combining a plurality of wafers on the circuit chain.

9. The method of in claim 3, wherein at least one of the plurality of circuit areas comprises a first metal layer and a solder resist layer formed on the first metal layer.

10. The method of in claim 9, wherein the solder resist layer has an opening to expose a portion of the first metal layer.

11. The method of claim 10, wherein a wafer is disposed within the opening of the solder resist layer.

12. The method of claim 9, wherein the solder resist layer has an opening to expose a portion of the flexible substrate.

13. The method of claim 9, further comprising:
forming a plurality of perforations on both sides of the circuit tape after cutting the flexible substrate.

14. The method of claim 13, wherein at least one of the plurality of perforations does not overlap with the first metal layer in a top-view perspective.

15. The method of claim 9, further comprising:
connecting at least a portion of the plurality of circuit tapes to form a circuit chain by at least one connection structure, wherein the connection structure extends from the solder resist layer of one of the plurality of circuit tapes to the solder resist layer of the other of the plurality of circuit tapes.

16. The method of claim 15 wherein the connection structure is formed on a portion of the plurality of circuit areas.

17. The method of claim 9, further comprising:
forming a second metal layer on the first metal layer.

18. The method of claim 9, wherein the first metal layer has a gap and a width of the gap is in a range from 0.3 mm to 8 mm.

* * * * *